United States Patent
Lee et al.

(10) Patent No.: US 11,976,967 B2
(45) Date of Patent: May 7, 2024

(54) ELECTRONIC DEVICE HAVING A PHOTODIODE AND CAPABLE OF SWITCHING BETWEEN LIGHT-SENSING FUNCTION AND LIGHT-CHARGING FUNCTION

(71) Applicant: InnoLux Corporation, Miao-Li County (TW)

(72) Inventors: Te-Yu Lee, Miao-Li County (TW); Yu-Tsung Liu, Miao-Li County (TW); Wei-Ju Liao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/820,963

(22) Filed: Aug. 19, 2022

(65) Prior Publication Data
US 2023/0094256 A1    Mar. 30, 2023

(30) Foreign Application Priority Data
Sep. 26, 2021 (CN) .......................... 202111127687.1

(51) Int. Cl.
*G01J 1/44*    (2006.01)
*G06V 40/13*    (2022.01)
(Continued)

(52) U.S. Cl.
CPC ............ *G01J 1/44* (2013.01); *G06V 40/1318* (2022.01); *H02J 7/35* (2013.01); *H03K 17/693* (2013.01);
(Continued)

(58) Field of Classification Search
CPC .......... G01J 1/44; G01J 2001/446; H02J 7/35; H02J 7/00; H02J 2207/50; H02J 50/001;
(Continued)

(56) References Cited

U.S. PATENT DOCUMENTS 11,288,484 B2    3/2022 You
2020/0210673 A1 *    7/2020 Krah ...................... G06V 40/13
(Continued)

FOREIGN PATENT DOCUMENTS

CN    109950235 A    6/2019

OTHER PUBLICATIONS

Extended European Search Report dated Feb. 8, 2023, issued in application No. EP 22191784.2.

*Primary Examiner* — Jennifer D Bennett
*Assistant Examiner* — Erin R Garber
(74) *Attorney, Agent, or Firm* — McClure, Qualey & Rodack, LLP (57) ABSTRACT

An electronic device includes a photodiode, a switching circuit, a readout circuit, and an energy storage device. The photodiode includes a first terminal and a second terminal and is configured to generate a signal according to a light. The switching circuit is electrically connected to the first terminal and the second terminal. When the electronic device operates in a sensing mode, the switching circuit electrically isolates the photodiode from the energy storage device so that the signal is provided to the readout circuit. When the electronic device operates in a charging mode, the switching circuit electrically connects the photodiode to the energy storage device so that the signal is provided to the energy storage device.

18 Claims, 10 Drawing Sheets

(51) Int. Cl.
    *H02J 7/35*     (2006.01)
    *H03K 17/693*   (2006.01)
    *H02J 7/00*     (2006.01)
    *H03K 17/96*    (2006.01)

(52) U.S. Cl.
    CPC .......... *G01J 2001/446* (2013.01); *H02J 7/00* (2013.01); *H02J 2207/50* (2020.01); *H03K 17/9627* (2013.01)

(58) Field of Classification Search
    CPC .......... G06V 40/1318; H03K 17/9627; H03K 17/693
    See application file for complete search history.

(56) References Cited

U.S. PATENT DOCUMENTS

| | | | |
|---|---|---|---|
| 2021/0058042 A1* | 2/2021 | Na | H03F 3/085 |
| 2021/0124896 A1 | 4/2021 | Ding et al. | |
| 2021/0210964 A1* | 7/2021 | Cao | H02J 7/00045 |

\* cited by examiner

FIG. 10

ELECTRONIC DEVICE HAVING A PHOTODIODE AND CAPABLE OF SWITCHING BETWEEN LIGHT-SENSING FUNCTION AND LIGHT-CHARGING FUNCTION

CROSS REFERENCE TO RELATED APPLICATIONS

This application claims priority of China Patent Application No. 202111127687.1, filed on Sep. 26, 2021, the entirety of which is incorporated by reference herein.

BACKGROUND OF THE INVENTION

Field of the Invention

The disclosure is generally related to an electronic device having a sensing function and a charging function, and more particularly it is related to an electronic device having a photodiode and capable of switching between a light-sensing function and a light-charging function.

Description of the Related Art

With the addition of functions such as touch control and fingerprint recognition, today's electronic devices use more and more battery power. If the sensing device in the current generation of electronic devices can also have the function of recharging the battery, then ambient light and the screen light can be converted into an electrical signal that can charge the battery, effectively prolonging the usage time of the electronic device and improving the convenience of charging it. In addition, this would contribute to a reduction in electricity bills and environmental pollution.

Therefore, it is necessary to optimize the sensing element to achieve the purpose of switching the sensing function and the light-charging function.

BRIEF SUMMARY OF THE INVENTION

An electronic device is provided in the disclosure, which includes a photodiode, a switching circuit, a readout circuit, and an energy storage device. The photodiode includes a first terminal and a second terminal and is configured to generate a signal according to a light. The switching circuit is electrically connected to the first terminal and the second terminal. When the electronic device operates in a sensing mode, the switching circuit electrically isolates the photodiode from the energy storage device so that the signal is provided to the readout circuit. When the electronic device operates in a charging mode, the switching circuit electrically connects the photodiode to the energy storage device so that the signal is provided to the energy storage device.

A detailed description is given in the following embodiments with reference to the accompanying drawings.

BRIEF DESCRIPTION OF DRAWINGS

The disclosure can be more fully understood by readout the subsequent detailed description and examples with references made to the accompanying drawings, wherein.

DETAILED DESCRIPTION OF THE INVENTION

This description is made for the purpose of illustrating the general principles of the disclosure and should not be taken in a limiting sense. In addition, the disclosure may repeat reference numerals and/or letters in the various examples. This repetition is for the purpose of simplicity and clarity and does not in itself dictate a relationship between the various embodiments and/or configurations discussed. The scope of the disclosure is best determined by reference to the appended claims.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the disclosure.

It is understood that the following disclosure provides many different embodiments, or examples, for implementing different features of the application. Specific examples of components and arrangements are described below to simplify the disclosure. These are, of course, merely examples and are not intended to be limiting. In addition, the disclosure may repeat reference numerals and/or letters in the various examples. This repetition is for the purpose of simplicity and clarity and does not in itself dictate a relationship between the various embodiments and/or configurations discussed.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Moreover, the formation of a feature on, connected to, and/or coupled to another feature in the disclosure that follows may include embodiments in which the features are formed in direct contact, and may also include embodiments in which additional features may be formed interposing the features, such that the features may not be in direct contact. Furthermore, the terms of joining and connecting may also include the case where both structures are movable or both structures are fixed. In addition, the term "coupled" includes any direct and indirect electrical connection means.

The electrical connection or coupling described in this disclosure may refer to direct connection or indirect connection. In the case of direct connection, the terminals of two devices in a circuit are directly connected or connected to each other through a conducting line. In the case of indirectly connection, there are switches, diodes, capacitors, inductors, resistors, other suitable components or a combination of the components mentioned above between the terminals of two devices in a circuit, but it is not limited thereto.

In the disclosure, the electronic device may include a display device, a backlight device, an antenna device, a sensing device or a splicing device, but is not limited thereto. The electronic device may be a bendable or flexible electronic device. The display device may be a non-self-luminous display device or a self-luminous display device. The antenna device may be a liquid crystal antenna device or a non-liquid-crystal antenna device, and the sensing device may be a sensing device for sensing capacitance, light, heat or ultrasonic waves, but it is not limited thereto. Electronic components may include passive and active components, such as capacitors, resistors, inductors, diodes, transistors, and the like. The diodes may include light-emitting diodes or light sensing diodes. The light-emitting diodes may, for example, include organic light-emitting diodes (OLEDs), sub-millimeter light-emitting diodes (mini LEDs), micro light-emitting diodes (micro LEDs), or quantum dot light-emitting diodes (quantum dot LED), but it is not limited thereto. The splicing device may be, for example, a display splicing device or an antenna splicing device, but it is not limited thereto. It should be noted that the electronic device can be any arrangement and combination of the foregoing, but it is not limited thereto. Hereinafter, the disclosure will be described by taking the display device as the electronic device or the splicing device, but the disclosure is not limited thereto.

Figure 1:
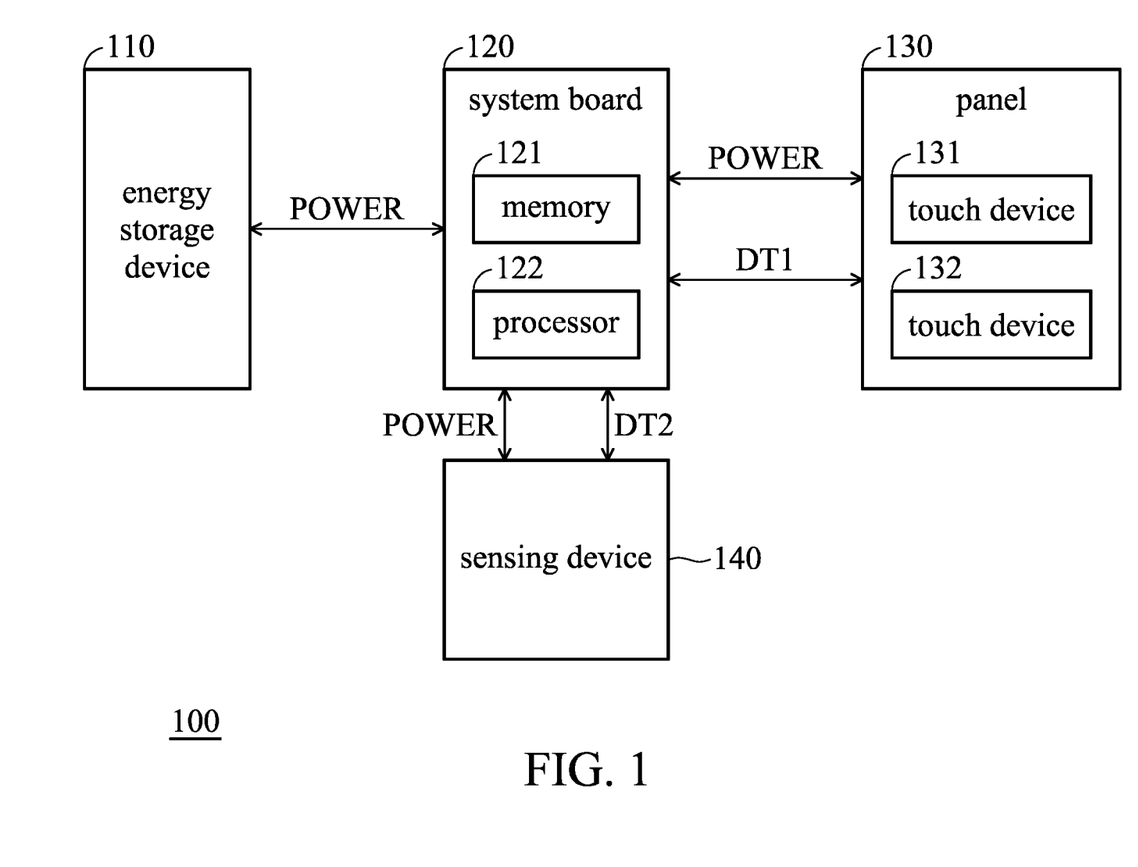
FIG. 1 is a block diagram illustrating an electronic device in accordance with an embodiment of the disclosure.

FIG. 1 is a block diagram illustrating an electronic device in accordance with an embodiment of the disclosure. As shown in FIG. 1, the electronic device 100 includes an energy storage device 110, a system board 120, a panel 130, and a sensing device 140. The energy storage device 110 is configured to store electrical energy POWER, and provides the stored electrical energy POWER to the system board 120. According to many embodiments of the disclosure, the energy storage device 110 may be a battery, a capacitor, or other device that can store electrical energy. For example, the energy storage device 110 may be a solar cell.

The system board 120 provides the electrical energy POWER provided by the energy storage device 110 to the panel 130 and the sensing device 140. The system board 120 and the panel 130 communicate to each other through the first data signal DT1, and the system board 120 communicates with the sensing device 140 through the second data signal DT2. As shown in FIG. 1, the system board 120 includes a memory 121 and a processor 122. The memory 121 is configured to store the fingerprint of the user, and the processor 122 is configured to operate in the sensing mode or the charging mode according to whether the touch device 131 is triggered.

The panel 130 includes a touch device 131 and a display 132, in which the display 132 has a display surface (not shown in the figure), the touch device 131 is located on the back side of the display surface, and the touch device 131 detects whether the display surface of the display 132 is touched. According to an embodiment of the disclosure, the sensing device 140 is disposed on the panel 130 and located on the back side of the display surface of the display 132. The sensing device 140 can sense light to generate the fingerprint information, and provide the generated fingerprint information to the processor 122 through the second data signal DT2. In some embodiments, the fingerprint information can be generated as images or data. In addition, the sensing device 140 can also sense light to generate electrical energy POWER to charge the energy storage device 110. According to an embodiment of the disclosure, the sensing device 140 is a photodiode.

According to an embodiment of the disclosure, when the touch device 131 detects that the display surface is touched, the processor 122 operates in a sensing mode to perform a fingerprint comparison, and the fingerprint information is compared with the user's fingerprint stored in the memory 121, in which the display surface of the display 132 can provide a light source. According to another embodiment of the disclosure, when the touch device 131 does not detect that the display surface is touched, the processor 122 operates in the charging mode, the sensing device 140 converts the received light into the photocurrent IL at this time, and the system board 120 controls the photocurrent IL generated by the sensing device 140 to charge the energy storage device 110.

Figure 2:
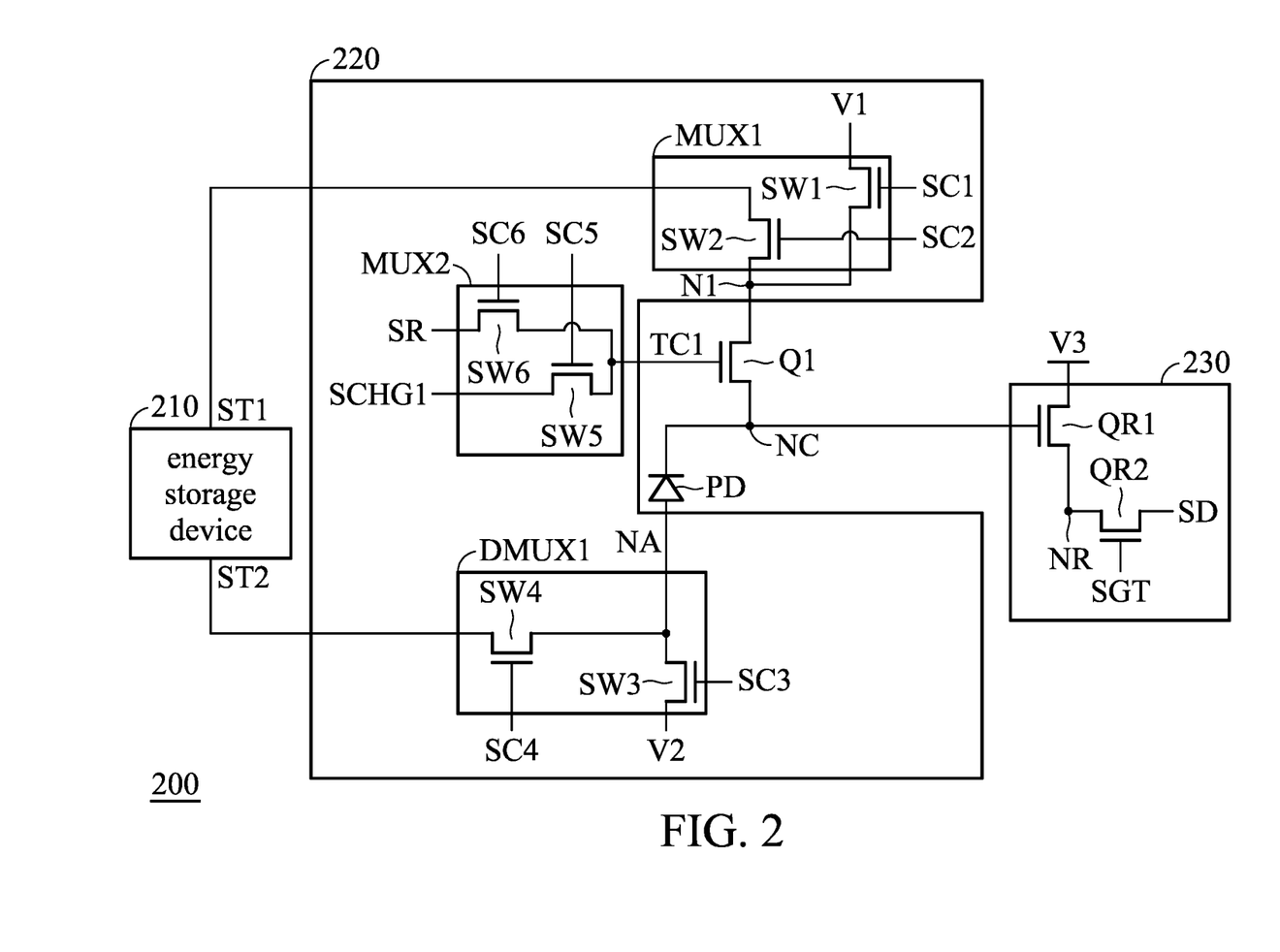
FIG. 2 is a circuit diagram illustrating an electronic circuit in accordance with an embodiment of the disclosure.

FIG. 2 is a circuit diagram illustrating an electronic circuit in accordance with an embodiment of the disclosure. As shown in FIG. 2, the electronic circuit 200 includes an energy storage device 210, a photodiode PD, a first switch Q1, a switching circuit 220, and a readout circuit 230, in which the energy storage device 210 corresponds to the energy storage device 110 in FIG. 1. According to an embodiment of the disclosure, the switching circuit 220 and the readout circuit 230 are located in the electronic device.

The photodiode PD includes a first terminal and a second terminal for detecting light to generate a signal, in which the photodiode PD corresponds to the sensing device 140 in FIG. 1. In some embodiments, the first terminal and the second terminal may be the anode terminal NA and the cathode terminal NC respectively, and the switching circuit 220 is electrically connected to the anode terminal NA of the photodiode PD and the first switch Q1 to be electrically connected to the cathode terminal NC of the photodiode PD. According to some embodiments of the disclosure, the electrical connection includes direct connection and indirect connection, and details about the electrical connection will not be repeated in the following paragraphs.

As shown in FIG. 2, the switching circuit 220 includes a first multiplexer MUX1, a first demultiplexer DMUX1, and a second multiplexer MUX2. The first switch Q1 is electrically connected between the first node N1 and the cathode terminal NC, and the first switch Q1 is turned on or off according to the signal received by the first control terminal TC1.

As shown in FIG. 2, the first multiplexer MUX1 includes a first selection switch SW1 and a second selection switch SW2, and the first selection switch SW1 provides the first voltage V1 to the first node N1 according to the first control signal SC1, the second selection switch SW2 electrically connects the first energy storage terminal ST1 to the first node N1 according to the second control signal SC2.

The first demultiplexer DMUX1 includes a third selection switch SW3 and a fourth selection switch SW4. The third selection switch SW3 provides the second voltage V2 to the anode terminal NA according to the third control signal SC3. The fourth selection switch SW4 electrically connects the second energy storage terminal ST2 to the anode terminal NA according to the fourth control signal SC4.

The second multiplexer MUX2 includes a fifth selection switch SW5 and a sixth selection switch SW6. The fifth selection switch SW5 provides a first charging signal SCHG1 to the first control terminal TC1 according to the fifth control signal SC5, and the sixth selection switch SW6 provides a reset signal SR to the first control terminal TC1 according to the sixth control signal SC6.

As shown in FIG. 2, the readout circuit 230 includes a first readout switch QR1 and a second readout switch QR2. The first readout switch QR1 generates the data signal SD based on the voltage of the cathode terminal NC. The second readout switch QR2 outputs the data signal SD according to the gate signal SGT. According to an embodiment of the disclosure, the first voltage V1 exceeds the second voltage V2, and the third voltage V3 exceeds the second voltage V2, but it is not limited thereto.

According to an embodiment of the disclosure, when the processor 122 of FIG. 1 operates in the sensing mode, the switching circuit 220 electrically separates the photodiode PD from the energy storage device 210, and utilizes the readout circuit 230 to read the voltage of the cathode terminal NC to output the output signal SD. According to another embodiment of the disclosure, when the processor 122 of FIG. 1 operates in the charging mode, the switching circuit 220 electrically connects the photodiode PD to the energy storage device 210, so that the photodiode PD can charge the energy storage device 210 by the photocurrent IL (as shown in FIG. 1) converted from light.

Figure 3:
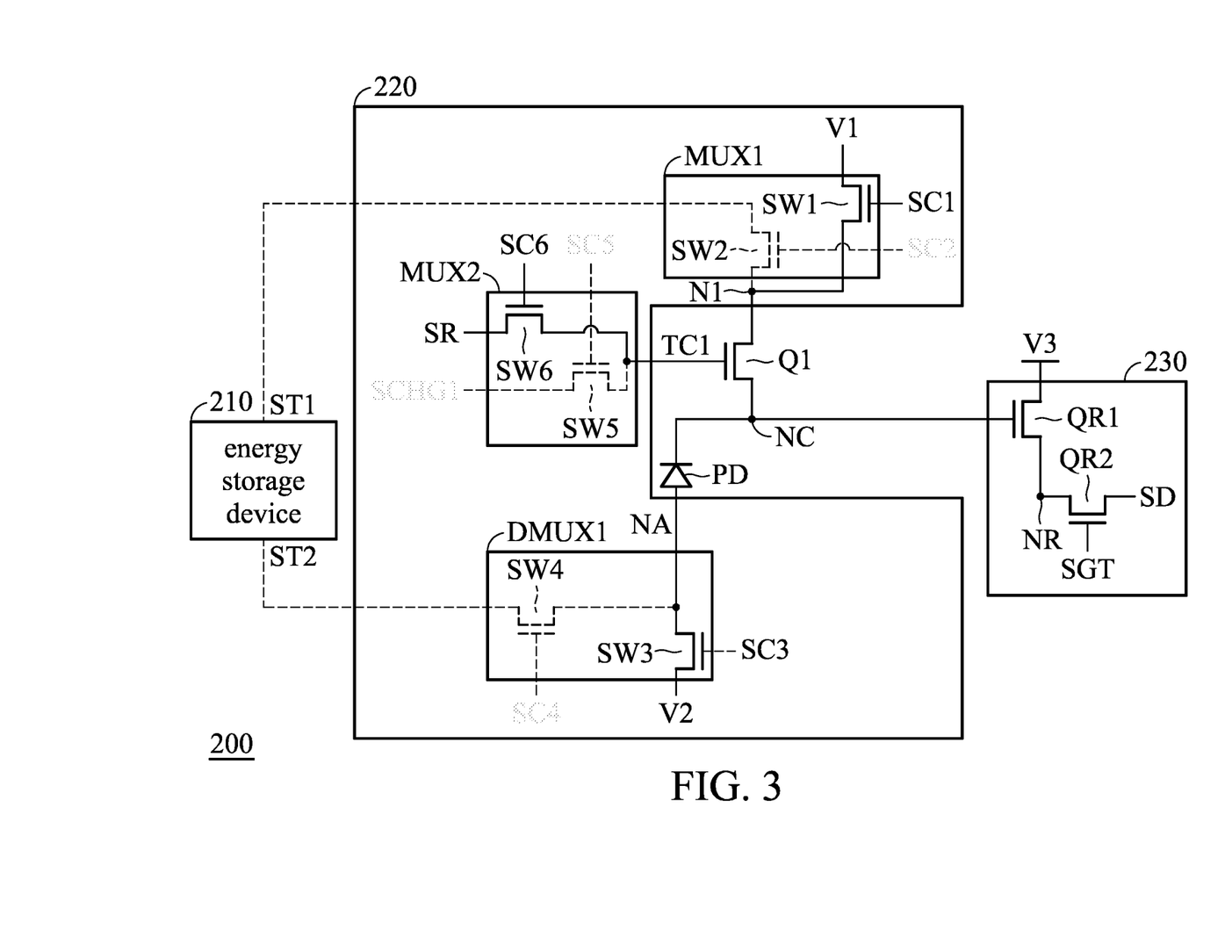
FIG. 3 is a schematic diagram illustrating an electronic circuit operating in a sensing mode in accordance with an embodiment of the disclosure.

FIG. 3 is a schematic diagram illustrating an electronic circuit operating in a sensing mode in accordance with an embodiment of the disclosure, in which the dotted line in FIG. 3 represents that the path of the switching circuit 220 remains non-conductive, and the solid line represents that the path of the switching circuit 220 operates in a sensing mode. According to an embodiment of the disclosure, when the processor 122 of FIG. 1 operates in the sensing mode, the electronic circuit 200 operates in a reset state, an exposure state, and a readout state in sequence, and the switching circuit 220 electrically isolates the photodiode PD from the energy storage device 210.

When the electronic circuit 200 operates in the reset state, the sixth selection switch SW6 of the second multiplexer MUX2 provides the reset signal SR to the first control terminal TC1 according to the sixth control signal SC6, so as to turn on the first switch Q1. The first selection switch SW1 of the first multiplexer MUX1 supplies the first voltage V1 to the cathode terminal NC through the first switch Q1 according to the first control signal SC1, and the third selection switch SW3 of the first demultiplexer DMUX1 supplies the second voltage V2 to the anode terminal NA according to the third control signal SC3.

After the reset state, the electronic circuit 200 operates in the exposure state. When the electronic circuit 200 operates in the exposure state, the first switch Q1 is turned off based on the reset signal SR, the first multiplexer MUX1 stops supplying the first voltage V1 to the first node N1, and the first demultiplexer DMUX1 continuously supplies the second voltage V2 to the anode terminal NA. According to an embodiment of the disclosure, when the electronic circuit 200 operates in an exposure state, the photodiode PD is configured to sense light to generate the fingerprint information. According to another embodiment of the disclosure, the photodiode PD senses the fingerprint in the exposure state.

After the exposure state, the electronic circuit 200 then operates in the readout state. When the electronic circuit 200 operates in the readout state, the first readout switch QR1 of the readout circuit 230 generates the data signal SD based on the voltage of the cathode terminal NC, and the second read switch QR2 outputs the data signal SD according to the gate signal SGT. According to an embodiment of the disclosure, the data signal SD is configured to represent a grayscale value, and the processor 122 in FIG. 1 compares the data signal SD with the fingerprint of the user stored in the memory 121 to complete the fingerprint identification.

Figure 4:
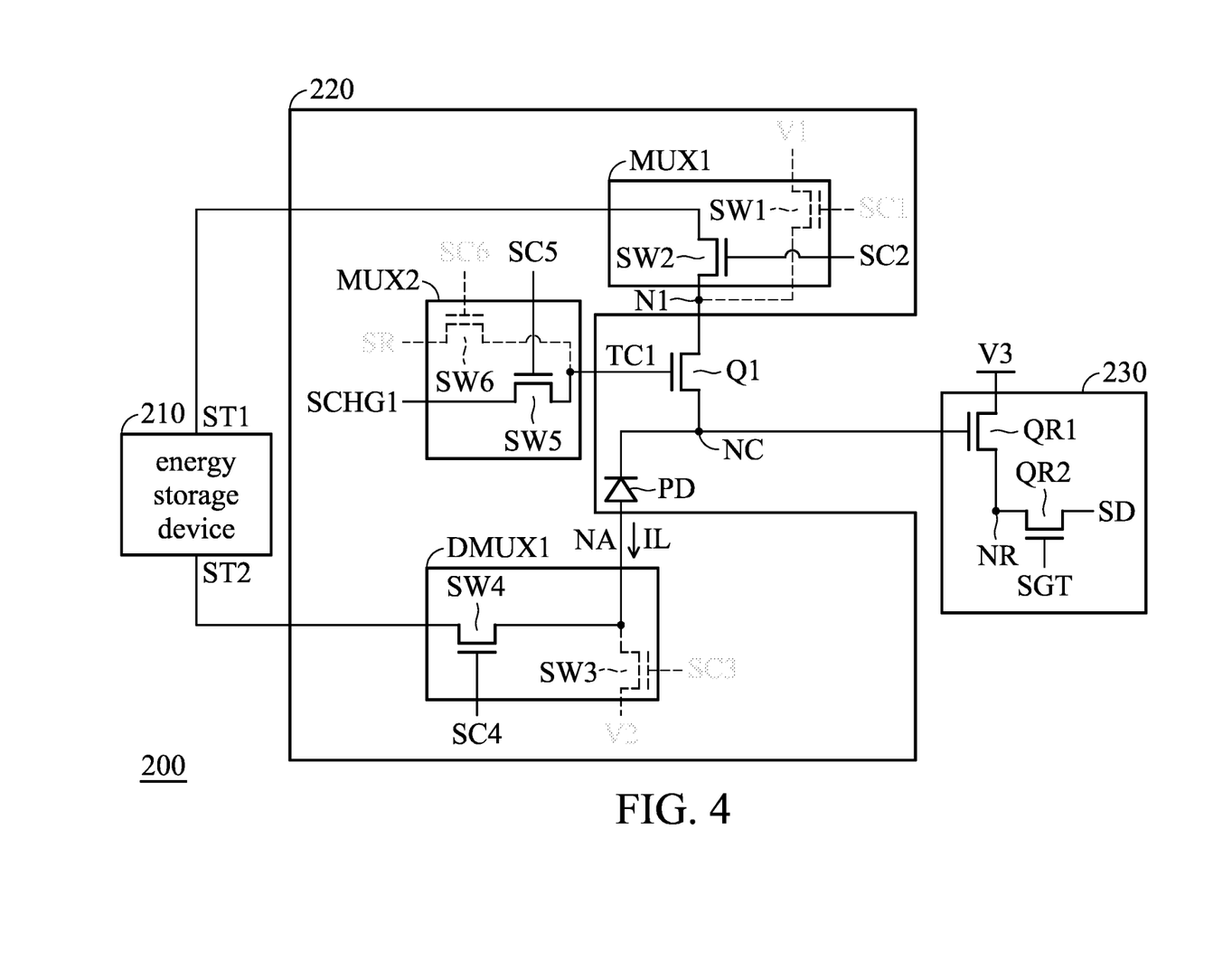
FIG. 4 is a schematic diagram illustrating an electronic circuit operating in a charging mode in accordance with an embodiment of the disclosure.

FIG. 4 is a schematic diagram illustrating an electronic circuit operating in a charging mode in accordance with an embodiment of the disclosure, in which the dotted line in FIG. 4 represents that the path of the switching circuit 220 remains non-conductive, and the solid line represents that the path of the switching circuit 220 operates in the charging mode. When the processor 122 of FIG. 1 operates in the charging mode, the fifth selection switch SW5 of the second multiplexer MUX2 supplies the first charging signal SCHG1 to the first control terminal TC1 according to the fifth control signal SC5, so as to turn on the first switch Q1. The second selection switch SW2 of the first multiplexer MUX1 electrically connects the first node N1 to the first energy storage terminal ST1 of the energy storage device 210 according to the second control signal SC2. The fourth selection switch SW4 of the first demultiplexer DMUX1 electrically connects the second energy storage terminal ST2 of the energy storage device 210 to the anode terminal NA according to the fourth control signal SC4. Therefore, the photodiode PD charges the energy storage device 210 with the photocurrent IL generated by the light sensed. According to an embodiment of the disclosure, the voltage of the second energy storage terminal ST2 exceeds the voltage of the first energy storage terminal ST1.

Figure 5:
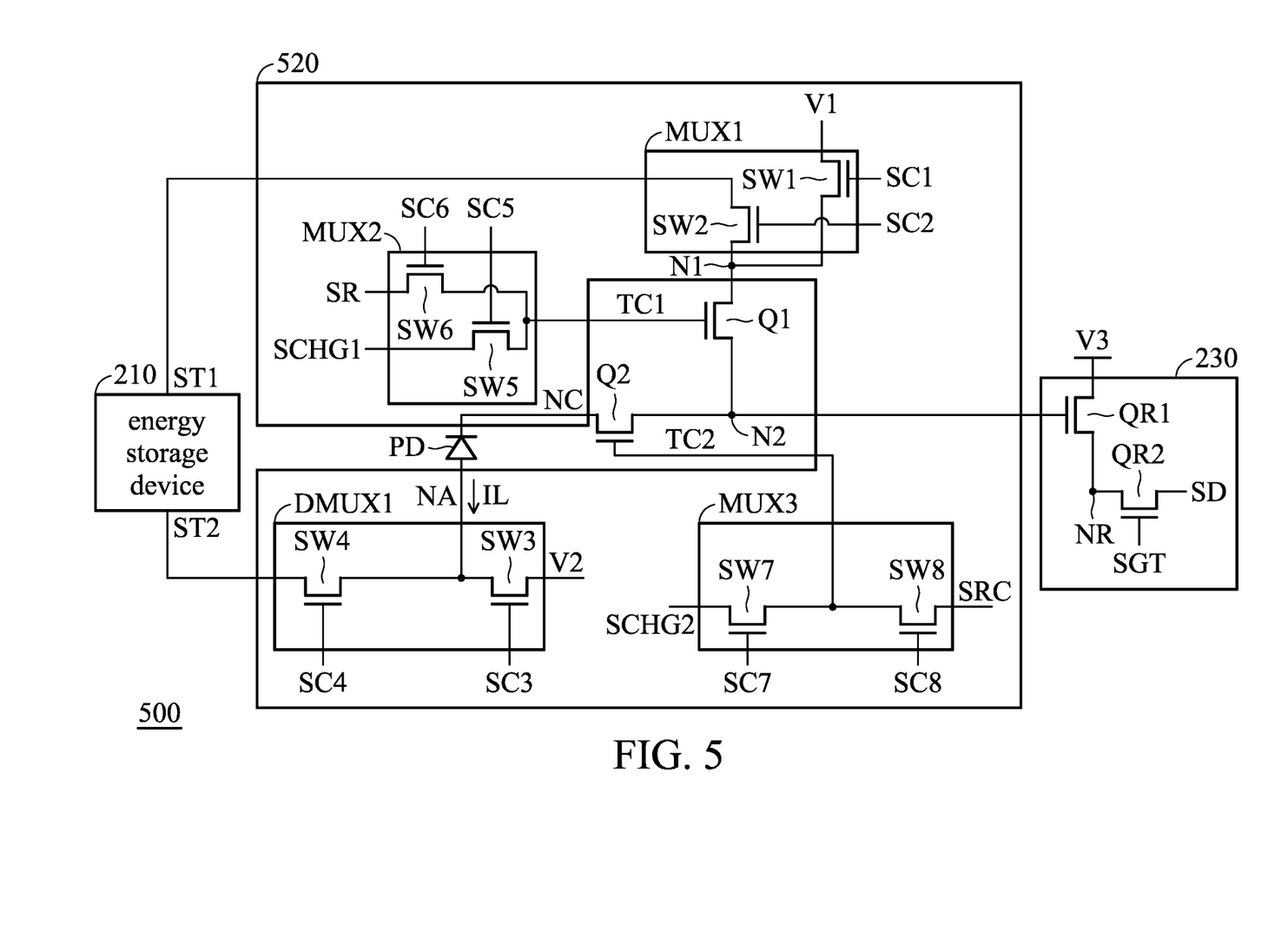
FIG. 5 is a circuit diagram illustrating an electronic circuit in accordance with another embodiment of the disclosure.

FIG. 5 is a circuit diagram illustrating an electronic circuit in accordance with another embodiment of the disclosure. Comparing the electronic circuit 500 of FIG. 5 with the electronic circuit 200 of FIG. 2, the electronic circuit 500 further includes a second switch Q2, and the switching circuit 520 of the electronic circuit 500 further includes a third multiplexer MUX3. The second switch Q2 is electrically connected between the first switch Q1 and the cathode terminal NC, and includes a second control terminal TC2, in which the second switch Q2 is turned on or off according to the signal received by the second control terminal TC2. The first switch Q1 and the second switch Q2 are electrically connected to the second node N2, and the readout circuit 230 generates the data signal SD based on the voltage of the second node N2.

The third multiplexer MUX3 includes a seventh selection switch SW7 and an eighth selection switch SW8. The seventh selection switch SW7 provides the second charging signal SCHG2 to the second control terminal TC2 according to the seventh control signal SC7, the eighth selection switch SW8 reads the control signal SRC according to the eighth control signal SC8.

Figure 6:
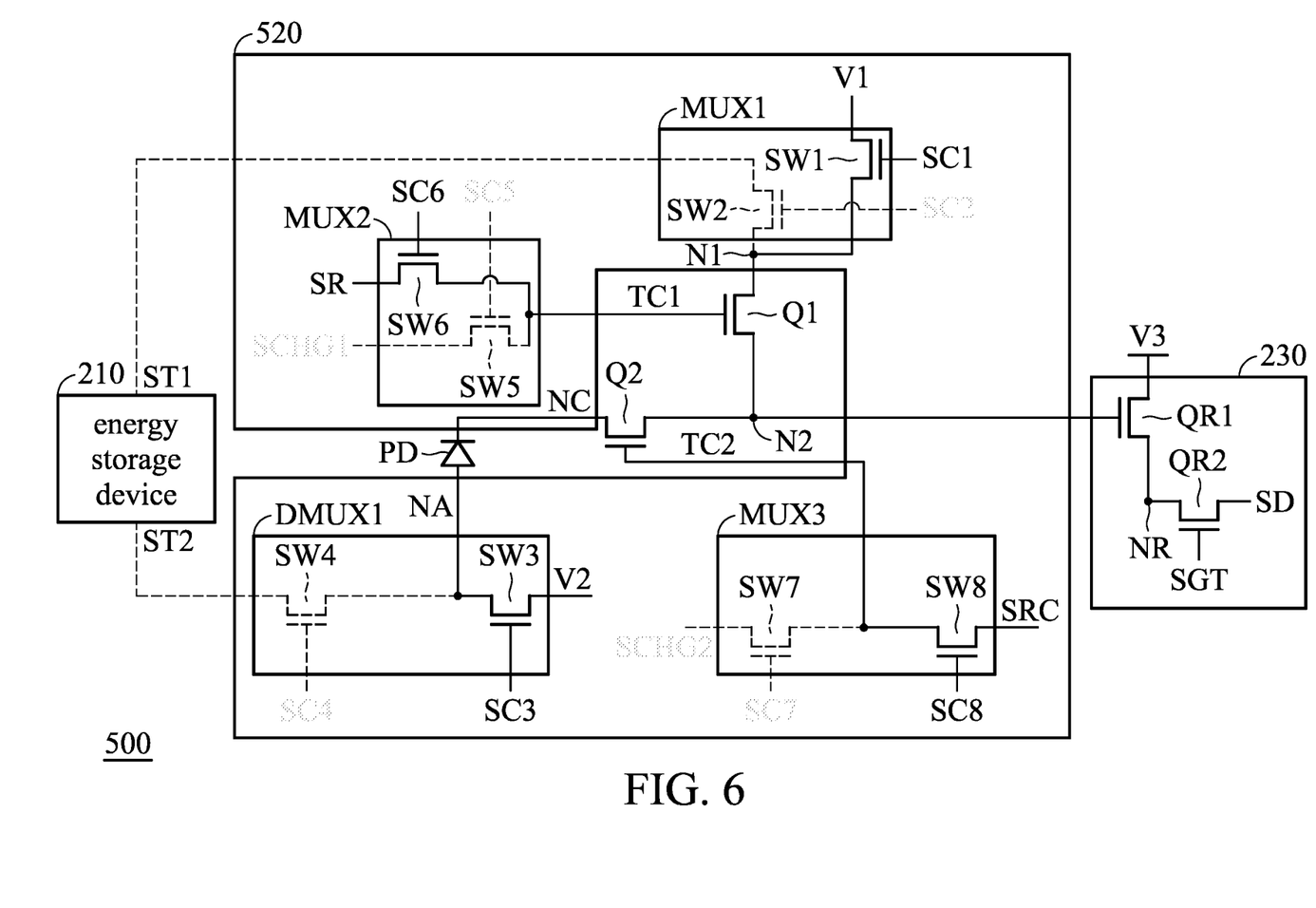
FIG. 6 is a schematic diagram illustrating an electronic circuit operating in a sensing mode in accordance with another embodiment of the disclosure.

FIG. 6 is a schematic diagram illustrating an electronic circuit operating in a sensing mode in accordance with another embodiment of the disclosure, in which the dotted line in FIG. 6 represents that the path of the switching circuit 520 remains non-conductive, and the solid line represents that the path of the switching circuit 520 operates in a sense mode. According to an embodiment of the disclosure, when the processor 122 of FIG. 1 operates in the sensing mode, the electronic circuit 500 operates in a reset state, an exposure state, and a readout state in sequence, and the switching circuit 520 electrically isolates the photodiode PD from the energy storage device 210.

When the electronic circuit 500 operates in the reset state, the sixth selection switch SW6 of the second multiplexer MUX2 provides the reset signal SR to the first control terminal TC1 according to the sixth control signal SC6, so as to turn on the first switch Q1. The eighth selection switch SW8 of the third multiplexer MUX3 provides the readout control signal SRC to the second control terminal TC2 according to the eighth control signal SC8, so as to turn on the second switch Q2. The first selection switch SW1 of the first multiplexer MUX1 supplies the first voltage V1 to the cathode terminal NC through the first switch Q1 and the second switch Q2 according to the first control signal SC1, and The third selection switch SW3 of the first demultiplexer DMUX1 provides the second voltage V2 to the anode terminal NA according to the third control signal SC3.

After the reset state, the electronic circuit 500 operates in the exposure state. When the electronic circuit 500 operates in the exposure state, the first switch Q1 is turned off based on the reset signal SR, and the eighth selection switch SW8 is turned off based on the eighth control signal SC8, so that the readout control signal SRC is stopped providing to the second switch Q2, the first multiplexer MUX1 stops providing the first voltage V1 to the first node N1, and the first demultiplexer DMUX1 continuously provides the second voltage V2 to the anode terminal NA. According to an embodiment of the disclosure, when the electronic circuit 500 operates in an exposure state, the photodiode PD is configured to sense light to generate the fingerprint information. According to another embodiment of the disclosure, the photodiode PD senses the fingerprint in the exposure state.

After the exposure state, the electronic circuit 500 then operates in the readout state. When the electronic circuit 500 operates in the readout state, the first readout switch QR1 of the readout circuit 230 generates the data signal SD based on the voltage of the second node N2. The second readout switch QR2 outputs the data signal SD according to the gate signal SGT. According to another embodiment of the disclosure, the first readout switch QR1 of the readout circuit 230 generates the data signal SD through the second switch Q2 based on the voltage of the cathode terminal NC. According to an embodiment of the disclosure, the data signal SD is configured to represent a grayscale value, and the processor 122 in FIG. 1 compares the data signal SD with the fingerprint of the user stored in the memory 121 to complete the fingerprint identification.

When the leakage phenomenon occurs at the cathode terminal NC of the photodiode PD, the data signal SD generated by the readout circuit 230 will be inaccurate. The second switch Q2 helps to reduce the leakage phenomenon of the cathode terminal NC, thereby improving the accuracy of the data signal SD generated by the readout circuit 230.

Figure 7:
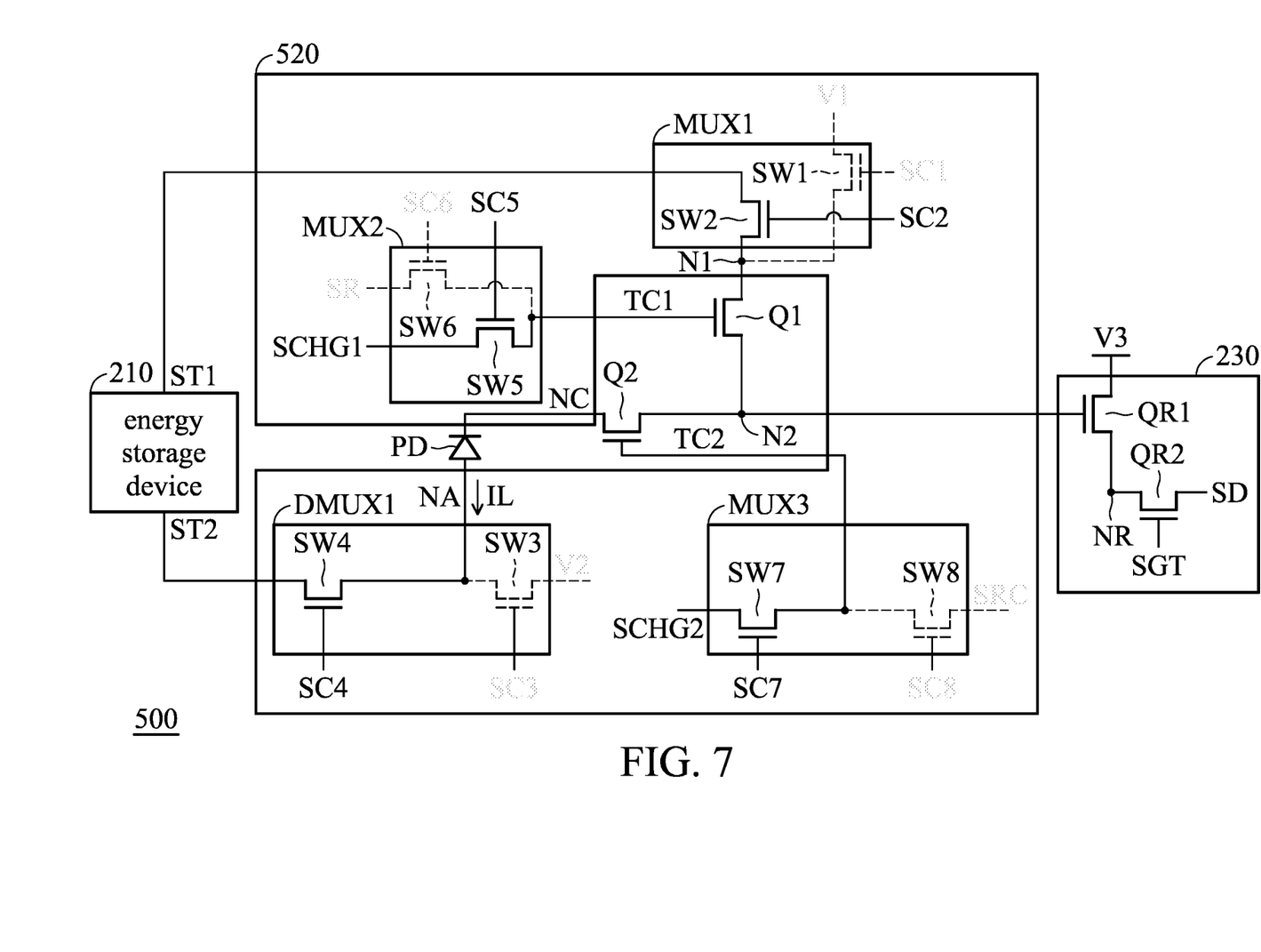
FIG. 7 is a schematic diagram illustrating an electronic circuit operating in a charging mode according to another embodiment of the disclosure.

FIG. 7 is a schematic diagram illustrating an electronic circuit operating in a charging mode according to another embodiment of the disclosure, in which the dotted line in FIG. 7 represents that the path of the switching circuit 520 remains non-conductive, and the solid line represents that the path of the switching circuit 520 operates in the charging mode. When the processor 122 of FIG. 1 operates in the charging mode, the electronic circuit 500 also operates in the charging mode, and the fifth selection switch SW5 of the second multiplexer MUX2 provides the first charging signal SCHG1 to the fifth control signal SC5 according to the fifth control signal SC5, so as to turn on the first switch Q1. The seventh selection switch SW7 of the third multiplexer MUX3 provides the second charging signal SCHG2 to the second control terminal TC2 according to the seventh control signal SC7, so as to turn on the second switch Q2.

In addition, the second selection switch SW2 of the first multiplexer MUX1 electrically connects the first node N1 to the first energy storage terminal ST1 of the energy storage device 210 according to the second control signal SC2. The fourth selection switch SW4 of the first demultiplexer DMUX1 electrically connects the second energy storage terminal ST2 of the energy storage device 210 to the anode terminal NA according to the fourth control signal SC4. Therefore, the photodiode PD can charge the energy storage device 210 with the photocurrent IL generated by the light sensed.

Figure 8:
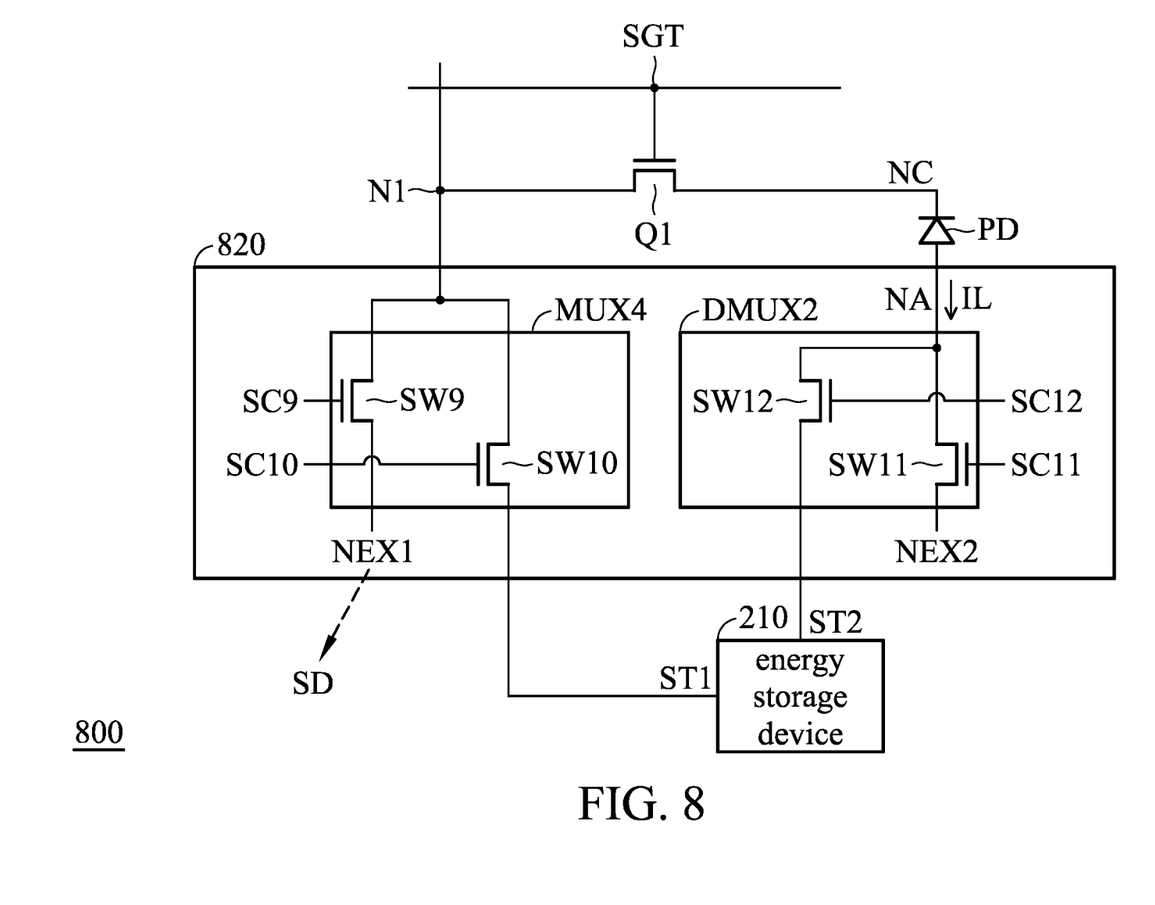
FIG. 8 is a circuit diagram illustrating an electronic circuit in accordance with another embodiment of the disclosure.

FIG. 8 is a circuit diagram illustrating an electronic circuit in accordance with another embodiment of the disclosure. As shown in FIG. 8, the electronic circuit 800 includes an energy storage device 210, a photodiode PD, a first switch Q1, and a switching circuit 820, in which the energy storage device 210 corresponds to the energy storage device 110 in FIG. 1. According to an embodiment of the disclosure, the switching circuit 820 is located in the electronic device. The switching circuit 820 is electrically connected between the energy storage device 210 and the photodiode PD, and the switching circuit 820 includes a fourth multiplexer MUX4 and a second demultiplexer DMUX2.

The first switch Q1 electrically connects the first node N1 to the cathode terminal NC according to the gate signal SGT. The fourth multiplexer MUX4 includes a ninth selection switch SW9 and a tenth selection switch SW10. The ninth selection switch SW9 electrically connects the first external node NEX1 to the first node N1 according to the ninth control signal SC9. The tenth selection switch SW10 electrically connects the first energy storage terminal ST1 of the energy storage device 210 to the first node N1 according to the tenth control signal SC10.

The second demultiplexer DMUX2 includes an eleventh selection switch SW11 and a twelfth selection switch SW12. The eleventh selection switch SW11 electrically connects the second external node NEX2 to the anode terminal NA according to the eleventh control signal SC11. The twelfth selection switch SW12 electrically connects the second energy storage terminal ST2 of the energy storage device 210 to the anode terminal NA according to the twelfth control signal SC12.

According to an embodiment of the disclosure, when the processor 122 of FIG. 1 operates in the sensing mode, the switching circuit 820 electrically isolates the photodiode PD from the energy storage device 210, and the first external The node NEX1 outputs an output signal SD. According to another embodiment of the disclosure, when the processor 122 in FIG. 1 operates in the charging mode, the switching circuit 820 electrically connects the photodiode PD to the energy storage device 210, so that the photodiode PD can charge the energy storage device 210 with the photocurrent IL converted from the light.

Figure 9:
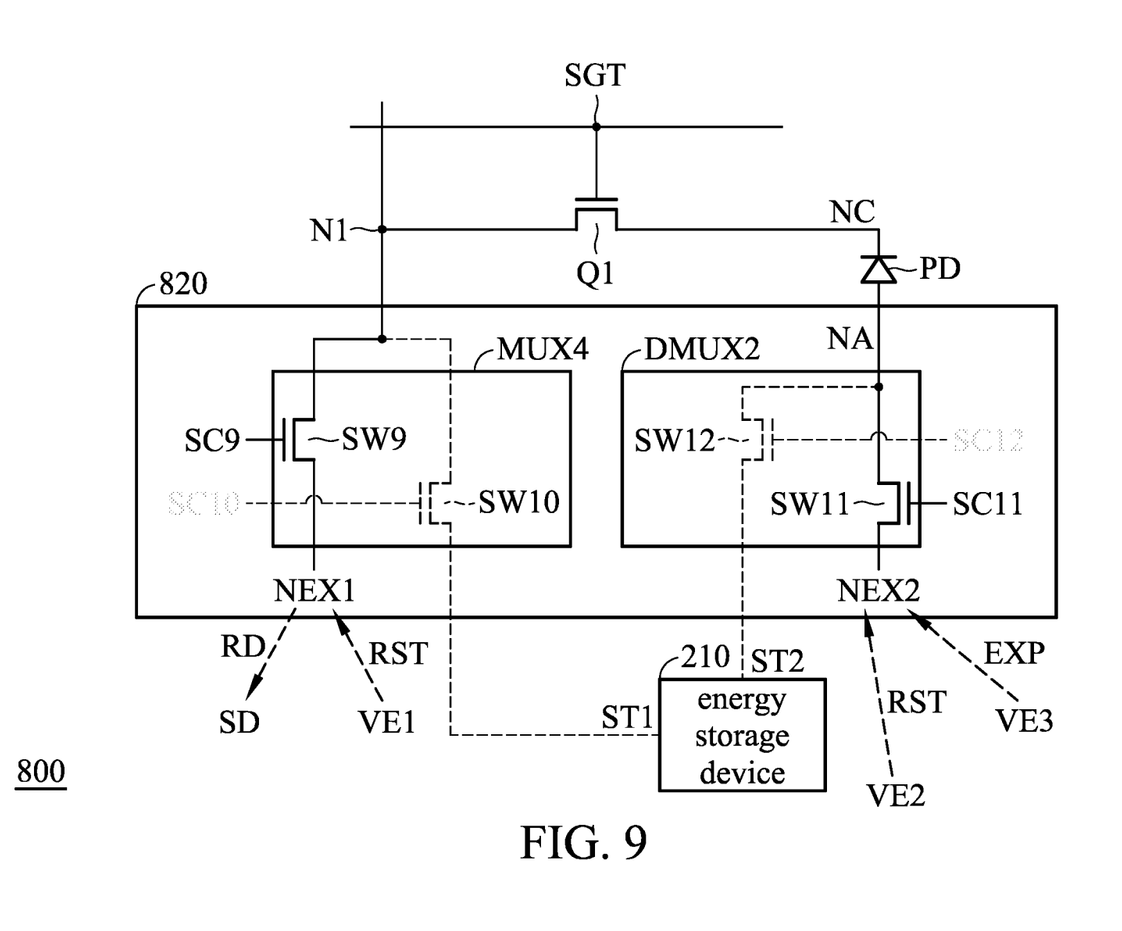
FIG. 9 is a schematic diagram illustrating an electronic circuit operating in a sensing mode in accordance with an embodiment of the disclosure.

FIG. 9 is a schematic diagram illustrating an electronic circuit operating in a sensing mode in accordance with an embodiment of the disclosure, in which the dotted line in FIG. 9 represents the path of the switching circuit 820 and remains non-conductive, and the solid line represents that the path of the switching circuit 820 operates in the sensing mode. According to an embodiment of the disclosure, when the processor 122 of FIG. 1 operates in the sensing mode, the electronic circuit 800 operates in the reset state RST, the exposure state EXP, and the readout state RD in sequence, and the switching circuit 820 electrically isolates the light The sense diode PD and the energy storage device 210 from each other.

When the electronic circuit 800 operates in the reset state RST, the first switch Q1 is turned on according to the gate signal SGT, and the ninth selection switch SW9 of the fourth multiplexer MUX4 electrically connects the first external node NEX1 to the first node N1 according to the ninth control signal SC9. The eleventh selection switch SW11 of the second demultiplexer DMUX2 electrically connects the second external node NEX2 to the anode terminal NA according to the eleventh control signal SC11. In addition, when the electronic circuit 800 operates in the reset state RST, the first external node NEXT receives the first external voltage VE1, and the second external node NEX2 receives the second external voltage VE2. According to an embodiment of the disclosure, the second external voltage VE2 exceeds the first external voltage VE1 Since the voltage of the anode terminal NA exceeds the voltage of the cathode terminal NC, the photodiode PD is forward biased, and the voltage difference between the anode terminal NA and the first node N1 is (VE1-VE2).

After the reset state RST, the electronic circuit 800 operates in the exposure state EXP. When the electronic circuit 800 operates in the exposure state EXP, the first switch Q1 is turned off according to the gate signal SGT, and the second external node NEX2 receives the third external voltage VE3. According to an embodiment of the disclosure, the third external voltage VE3 is smaller than the second external voltage VE2. When the electronic circuit 800 operates in the exposure state EXP, the photodiode PD is reverse biased. According to an embodiment of the disclosure, when the electronic circuit 800 operates in the exposure state EXP, the photodiode PD is configured to sense the light to generate the fingerprint information. According to another embodiment of the disclosure, the photodiode PD performs the fingerprint sensing in the exposure state EXP.

After the exposure state EXP, the electronic circuit 800 then operates in the readout state RD. When the electronic circuit 800 operates in the readout state RD, the first switch Q1 is turned on according to the gate signal SGT, and the voltage of the cathode terminal NC is passed through the first switch Q1 and the fourth multiplexer MUX4 to generate the data signal SD at the first external node NEX1. According to an embodiment of the disclosure, the data signal SD is a DC voltage, in which the DC voltage value of the data signal SD is configured to represent a grayscale value, and the processor 122 in FIG. 1 compares the data signal SD with the user's fingerprints stored in the memory 121 to complete the fingerprint identification.

Figure 10:
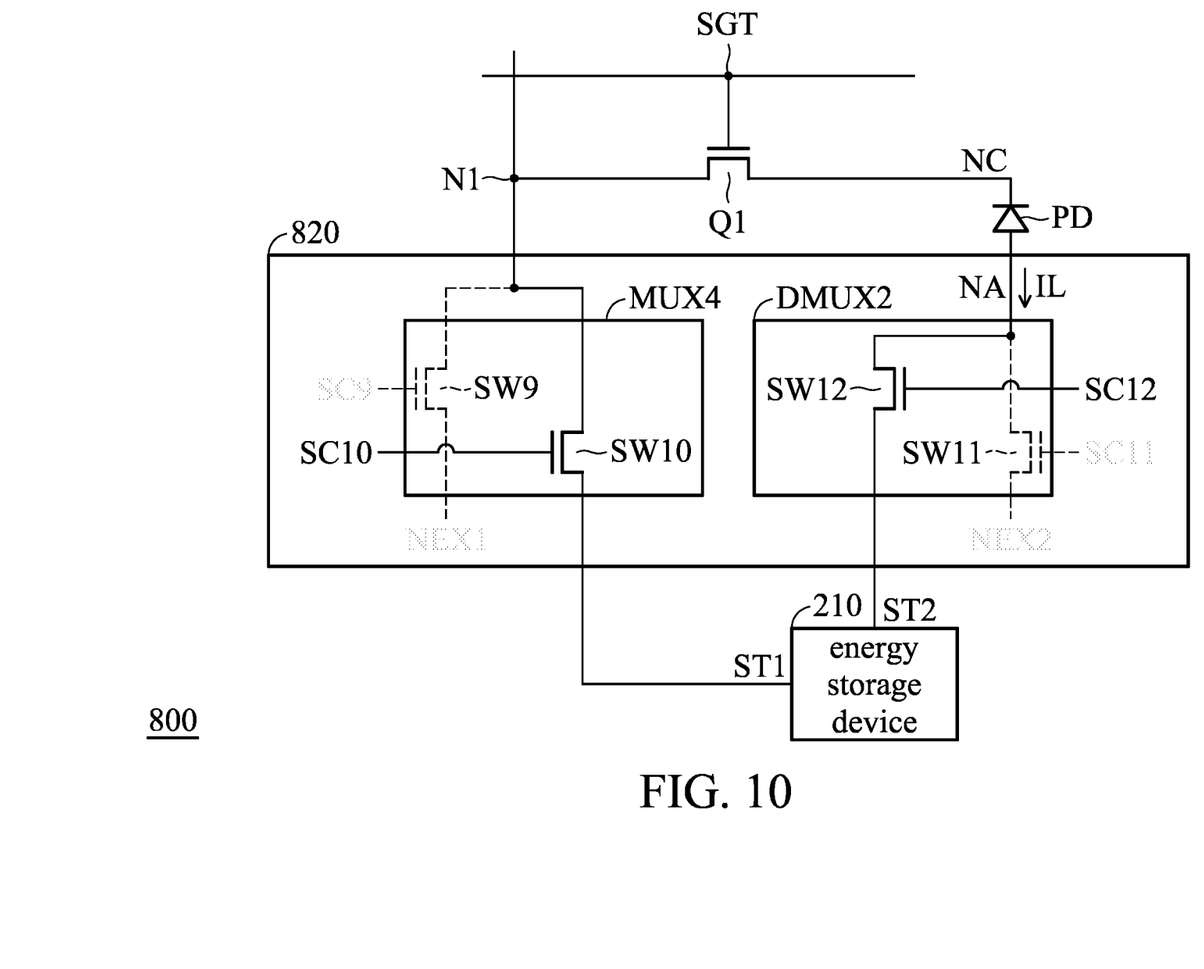
FIG. 10 is a schematic diagram illustrating an electronic circuit operating in a charging mode in accordance with another embodiment of the disclosure.

FIG. 10 is a schematic diagram illustrating an electronic circuit operating in a charging mode in accordance with another embodiment of the disclosure, in which the dotted line in FIG. 10 represents that the path of the switching circuit 820 remains non-conductive, and the solid line represents that the path of the switching circuit 820 operates in the charging mode. When the electronic circuit 800 operates in the charging mode, the first switch Q1 is turned on according to the gate signal SGT, the fourth multiplexer MUX4 electrically connects the first node N1 to the first energy storage terminal ST1 of the energy storage device 210, and the second demultiplexer DMUX2 electrically connects the second energy storage terminal ST2 of the energy storage device 210 to the anode terminal NA. Therefore, the photodiode PD charges the energy storage device 210 with the photocurrent IL generated by the light sensed. According to an embodiment of the disclosure, the voltage of the second energy storage terminal ST2 exceeds the voltage of the first energy storage terminal ST1.

The disclosure proposes an electronic device with a photodiode having an optical sensing function and a solar charging function that are switchable, so that the photodiode can charge the energy storage device in addition to fingerprint recognition, thereby effectively prolonging the use time of the electronic device or improving the convenience of charging the electronic device.

Although some embodiments of the disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps.

What is claimed is:

1. An electronic device, comprising:
   a photodiode, comprising a first terminal and a second terminal and configured to generate a signal according to a light;
   a switching circuit, electrically connected to the first terminal and the second terminal;
   a readout circuit;
   an energy storage device; and
   a first switch, electrically connected between a first node and the second terminal and comprising a first control terminal, wherein the first switch is turned on or off according to a signal received by the first control terminal;
   wherein when the electronic device operates in a sensing mode, the switching circuit is configured to electrically isolate the photodiode and the energy storage device from each other so that the signal is provided to the readout circuit, wherein when the electronic device operates in a charging mode, the switching circuit electrically connects the photodiode to the energy storage device so that the signal is provided to the energy storage device;

wherein the switching circuit comprises a first multiplexer, a first demultiplexer, and a second multiplexer, wherein the first multiplexer provides a first voltage to the first node according to a first control signal, and electrically connects the first node to a first energy storage terminal of the energy storage device according to a second control signal, wherein the first demultiplexer provides a second voltage to the first terminal according to a third control signal, and electrically connects a second energy storage terminal of the energy storage device to the first terminal according to a fourth control signal, wherein the second multiplexer provides a first charge signal to the first control terminal according to a fifth control signal, and provides a reset signal to the first control terminal according to a sixth control signal.

2. The electronic device as defined in claim 1, wherein when the electronic device operates in the sensing mode, the electronic device operates in a reset state, an exposure state, and a readout state in sequence.

3. The electronic device as defined in claim 2, wherein when the electronic device operates in the reset state, the second multiplexer provides the reset signal to the first control terminal to turn on the first switch, the first multiplexer provides the first voltage to a second node through the first switch, and the first demultiplexer provides the second voltage to the first terminal.

4. The electronic device as defined in claim 3, wherein when the electronic device operates in the exposure state, the first switch is turned off according to the reset signal, the first multiplexer stops providing the first voltage, and the first demultiplexer keeps providing the second voltage to the first terminal, wherein when the electronic device operates in the readout state, the readout circuit receives a voltage of the second node to generate a data signal.

5. The electronic device as defined in claim 1, wherein when the electronic device operates in the charging mode, the second multiplexer provides the first charge signal to the first control terminal to turn on the first switch, the first multiplexer electrically connects the first node to the first energy storage terminal of the energy storage device, and the first demultiplexer electrically connects the second energy storage terminal of the energy storage device to the first terminal, so that the photodiode charges the energy storage device, wherein a voltage of the second energy storage terminal exceeds a voltage of the first energy storage terminal.

6. The electronic device as defined in claim 1, wherein the readout circuit comprises:
a first readout switch, generating a data signal according to a voltage of the second terminal; and
a second readout switch, outputting the data signal according to a gate signal.

7. The electronic circuit as defined in claim 1, further comprising:
a second switch, electrically connected between the first switch and the second terminal and comprising a second control terminal, wherein the second switch is turned on or off according to a signal received by the second control terminal, wherein the first switch and the second switch are electrically connected to a second node, wherein the readout circuit receives a voltage of the second node.

8. The electronic device as defined in claim 7, wherein the switching circuit further comprises:
a third multiplexer, wherein the third multiplexer provides a second charging signal to the second control terminal according to a seventh control signal, and provides a readout control signal to the second control terminal according to an eighth control signal.

9. The electronic device as defined in claim 8, wherein when the electronic device operates in the reset state, the second multiplexer provides the reset signal to the first control terminal to turn on the first switch, the third multiplexer provides the readout control signal to the second control terminal to turn on the second switch, the first multiplexer provides the first voltage to the second terminal through the first switch and the second switch, and the first demultiplexer provides the second voltage to the first terminal.

10. The electronic device as defined in claim 9, wherein when the electronic device operates in the exposure state, the first switch is turned off according to the reset signal, the second switch is turned off according to the readout control signal, the first multiplexer stops providing the first voltage, and the first demultiplexer keeps providing the second voltage to the first terminal.

11. The electronic device as defined in claim 10, wherein when the electronic device operates in the readout state, the second switch is turned on according to the readout control signal so that a voltage of the second terminal is provided to the readout circuit through the second switch, wherein the readout circuit receives the voltage of the second terminal to generate a data signal.

12. The electronic device as defined in claim 10, wherein when the electronic device operates in the charging mode, the second multiplexer provides the first charging signal to the first control terminal to turn on the first switch, the third multiplexer provides the second charging signal to the second control terminal to turn on the second switch, the first multiplexer electrically connects the first node to the first energy storage terminal of the energy storage device, and the first demultiplexer electrically connects the second energy storage terminal of the energy storage device to the first terminal, so that the photodiode charges the energy storage device, wherein a voltage of the second energy storage terminal exceeds a voltage of the first energy storage terminal.

13. The electronic device as defined in claim 1, wherein the switching circuit comprises a first multiplexer and a first demultiplexer, wherein the first multiplexer electrically connects a first external node to a first node according to a first control signal, and electrically connects the first node to a first energy storage terminal of the energy storage device, wherein the first demultiplexer electrically connects a second external node to the first node according to a second control signal, and electrically connects a second energy storage terminal of the energy storage device to the first node according to a third control signal.

14. The electronic device as defined in claim 13, wherein when the electronic device operates in the sensing mode, the electronic device operates in a reset state, an exposure state, and a readout state in sequence.

15. The electronic device as defined in claim 14, wherein when the electronic device operates in the reset state, a first switch is turned on according to a gate signal, the first multiplexer electrically connects the first external node to the first node, and the first demultiplexer electrically connects the second external node to the first terminal, wherein when the electronic device operates in the reset state, the first external node receives a first external voltage, the second external node receives a second external voltage, and the second external voltage exceeds the first external voltage, wherein the photodiode is forward-biased, and a voltage difference from the first terminal to the first node is equal to the first external voltage minus the second external voltage.

16. The electronic device as defined in claim 15, wherein when the electronic device operates in the exposure state, the first switch is turned off according to the gate signal, the second external node receives a third external voltage, wherein the third external voltage is less than the second external voltage, wherein when the electronic device operates in the exposure state, the photodiode is reverse-biased.

17. The electronic device as defined in claim 16, wherein when the electronic device operates in the readout state, the first switch is turned on according to the gate signal, and a voltage of the second terminal generates a data signal at the first external node through the first switch and the first multiplexer.

18. The electronic device as defined in claim 17, wherein when the electronic device operates in the charging mode, the first switch is turned on according to the gate signal, the first multiplexer electrically connects the first node to the first energy storage terminal of the energy storage device, and the first demultiplexer electrically connects the second energy storage terminal of the energy storage device to the first terminal, wherein a voltage of the second energy storage terminal exceeds a voltage of the first energy storage terminal.

* * * * *